United States Patent
Bae

(10) Patent No.: US 7,736,843 B2
(45) Date of Patent: Jun. 15, 2010

(54) METHOD FOR MANUFACTURING A SEMICONDUCTOR DEVICE

(75) Inventor: Sang Man Bae, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 388 days.

(21) Appl. No.: 11/944,746

(22) Filed: Nov. 26, 2007

(65) Prior Publication Data
US 2008/0241766 A1    Oct. 2, 2008

(30) Foreign Application Priority Data
Mar. 30, 2007    (KR)    ............... 10-2007-0031798

(51) Int. Cl.
G03F 7/00 (2006.01)
G03F 7/40 (2006.01)
G03F 7/34 (2006.01)
G03F 7/36 (2006.01)

(52) U.S. Cl. ............... 430/330; 430/311; 430/322; 430/331

(58) Field of Classification Search ............ 430/311, 430/313, 314, 318, 322, 330, 331
See application file for complete search history.

(56) References Cited

U.S. PATENT DOCUMENTS

| 6,440,642 | B1 * | 8/2002 | Shelnut et al. | 430/315 |
|---|---|---|---|---|
| 6,444,408 | B1 * | 9/2002 | Brock et al. | 430/322 |
| 6,492,092 | B1 * | 12/2002 | Foster et al. | 430/271.1 |
| 6,703,186 | B1 * | 3/2004 | Yanagimoto et al. | 430/314 |
| 7,556,913 | B2 * | 7/2009 | Furuse et al. | 430/311 |
| 2002/0150838 | A1 * | 10/2002 | Zhang et al. | 430/311 |
| 2004/0081921 | A1 * | 4/2004 | Yamashita | 430/322 |
| 2007/0105057 | A1 * | 5/2007 | Hwang et al. | 430/322 |

FOREIGN PATENT DOCUMENTS

| JP | 03-217833 | 9/1991 |
|---|---|---|
| JP | 2000-330288 | 11/2000 |
| JP | 2000-330289 | 11/2000 |

* cited by examiner

*Primary Examiner*—Amanda C. Walke
(74) *Attorney, Agent, or Firm*—Marshall, Gerstein & Borun LLP

(57) ABSTRACT

To overcome the limitations to development of photosensitive layers in a lithography process using a light source such as KrF, ArF, VUV, EUV, E-beam, ion beam, etc., and a patterning process of a large circuit board or a bending substrate, the invention provides a method for manufacturing a semiconductor device in which the photosensitive layer comprises a thermal acid generator that is reacted with heat to form an acid, and a masking process in a lithography process using a light source is performed as a heat conduction process using a thermally conductive pattern so that a patterning process is performed easily without limiting the size and shape of a semiconductor substrate.

8 Claims, 3 Drawing Sheets

METHOD FOR MANUFACTURING A SEMICONDUCTOR DEVICE

CROSS-REFERENCE TO RELATED APPLICATION

The priority of Korean patent application number 10-2007-0031798 filed Mar. 30, 2007, the entire disclosure of which is incorporated by reference in its entirety, is claimed.

BACKGROUND OF THE INVENTION

The invention relates to a method for manufacturing a semiconductor device. In the prior art, there have been limitations to development of photosensitive layers in lithography processes using light sources such as KrF, ArF, Visible Ultraviolet (VUV), Extreme Ultraviolet (EUV), E-beam, ion beam, etc., and patterning processes of large circuit boards or bent substrates. To solve these problems, the invention provides a method for manufacturing a semiconductor device in which the photosensitive layer comprises a thermal acid generator that reacts with heat to form an acid, and a masking process in a lithography process using a light source is performed as a heat conduction process using a pattern of a thermally conductive substance so that a patterning process is easily performed without limiting the size and shape of the semiconductor substrate.

In a process of manufacturing semiconductor micro circuits using a 248 nm light source (KrF), a microcircuit of 150 nm LINE/SPACE has previously been formed, and trials for forming patterns equal to or less than 150 nm are being undertaken. Meanwhile, to form more fine microcircuits, a study on microcircuit fabrication processes using a light source of low wavelength such as ArF (193 nm), F2 (157 nm), Extreme Ultraviolet (13 nm), etc., is being undertaken. However, a photosensitizer resin with a good permeability of these wavelengths is difficult to develop. The resins of the photosensitizer used in i-line (365 nm) and KrF (248 nm) contain aromatic compounds, and these resins cannot be used due to large absorbancies of 193 nm by the resin. For this reason, photosensitizers for 193 nm contain resins of acryl groups or alicyclic groups that do not contain aromatic compounds. However, these resins have relatively large absorbancies of 193 nm light and it is accordingly difficult to form good patterns.

Accordingly, most attempts to overcome the problems above focused on resins with low absorbency of a light source, but there is a limitation to the development of resins, particularly using VUV (157 nm) or EUV (13 nm).

Additionally, in the case of forming a large circuit pattern, the thickness of a photosensitive layer may increase to several mm or several cm, and thus it is impossible to perform a photolithography process on the photosensitive layer. Meanwhile, if the semiconductor substrate to be pattern is bent, or the substrate is spherical in shape, the photolithography process using a light source cannot be adapted for use.

BRIEF SUMMARY OF THE INVENTION

A method for manufacturing a semiconductor device comprises forming a thermally conductive pattern of a thermally conductive substance over a semiconductor substrate, applying a photosensitive composition comprising a thermal acid generator to form a photosensitive layer on the entire surface of the semiconductor substrate including the thermally conductive pattern, applying heat to the thermally conductive pattern to change a predetermined region of the photosensitive layer adjacent to the thermally conductive pattern into a heat sensing region, removing the heat sensing region with a developing liquid and removing the thermally conductive pattern to form a photosensitive layer pattern.

The photosensitive composition preferably comprises a heat acid generator on an amount of 0.1 to 10 parts by weight per 100 parts by weight of a base polymer; the thermally conductive substance pattern preferably uses any one of gold (Au), silver (Ag), aluminum (Al), iron (Fe), copper (Cu), platinum (Pt), tungsten (W), and mixtures thereof; heat is preferably applied at a temperature of 150° C. to 200° C. to the thermally conductive substance pattern, preferably by an alternative power source or a thermal source; and, the surface of the semiconductor substrate is preferably formed as a three-dimensional cubic structure.

Meanwhile, the method for manufacturing a semiconductor device according to another embodiment comprises applying a photosensitive composition containing a thermal acid generator over a semiconductor substrate and forming a first photosensitive layer thereon, forming a thermally conductive pattern of a thermally conductive substance over the first photosensitive layer, forming a second photosensitive layer over the first photosensitive layer including the thermally conductive pattern, applying heat to the thermally conductive substance pattern to change a predetermined region of the photosensitive layer adjacent to the thermally conductive pattern into a heat sensing region, removing the heat sensing region with a developing liquid and removing the thermally conductive pattern to form a photosensitive layer pattern.

Additionally, a method for manufacturing a semiconductor device according to another embodiment comprises applying a photosensitive composition containing a thermal acid generator over a semiconductor substrate and forming a photosensitive layer thereon, contacting a mask including a thermally conductive pattern formed of a thermally conductive substance with an upper surface of the photosensitive layer, applying heat to the thermally conductive substance pattern to change a predetermined region of the photosensitive layer adjacent to the thermally conductive pattern into a heat sensing region, removing the mask, and then removing the heat sensing region with a developing liquid to form a photosensitive layer pattern.

DESCRIPTION OF SPECIFIC EMBODIMENTS

FIGS. 1a to 1e are sectional views of a method for manufacturing a semiconductor device according to the invention.

Figure 1A:
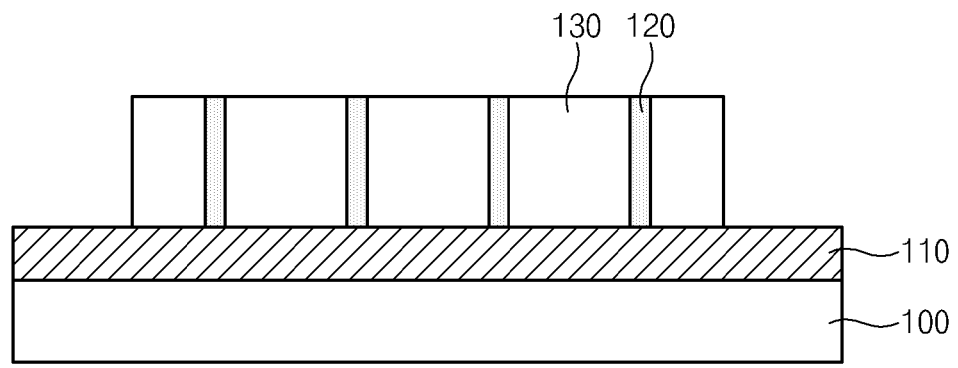
FIGS. 1a to 1e are sectional views of a method for manufacturing a semiconductor device according to the invention.

Referring to FIG. 1a, an etching-target layer 110 is formed over a semiconductor substrate 100. Next, patterns to be formed over the semiconductor substrate 100 are designed, and a thermally conductive pattern 120 of a thermally conductive substance is formed over the etching-target layer 110 in an etching region on which patterns are not formed. Subsequently, a photosensitive layer 130 comprising a thermal acid generator is formed on the entire semiconductor substrate including the thermally conductive pattern 120. At this time, the photosensitive layer is preferably formed using a photosensitive composition containing 0.1 to 10 parts by weight of the thermal acid generator per 100 parts by weight of a base polymer, and the thermally conductive pattern 120 preferably is formed of a thermally conductive substance selected from the group consisting of gold (Au), silver (Ag), aluminum (Al), iron (Fe), copper (Cu), platinum (Pt), tungsten (W), and mixtures thereof. The thermally conductive pattern 120 may formed as a plate shape, as shown, or formed on the interface between the photosensitive layer 130 and the etching-target region 110 as a line pattern, or formed over the photosensitive layer 130 as a line pattern. Meanwhile, the thermally conductive pattern may formed on A separate mask.

If the thermally conductive pattern 120 is formed as a line pattern, the process of defining patterns is easily performed to form freely designed patterns. Further, there is no limitation to the thickness of the photosensitive layer 130, which influences a lithography process utilizing a light source, and thus the thickness of the photosensitive layer 130 can be increased within a range allowing thermal conductivity, thereby being adapted easily to a large circuit pattern formation process.

Figure 1B:
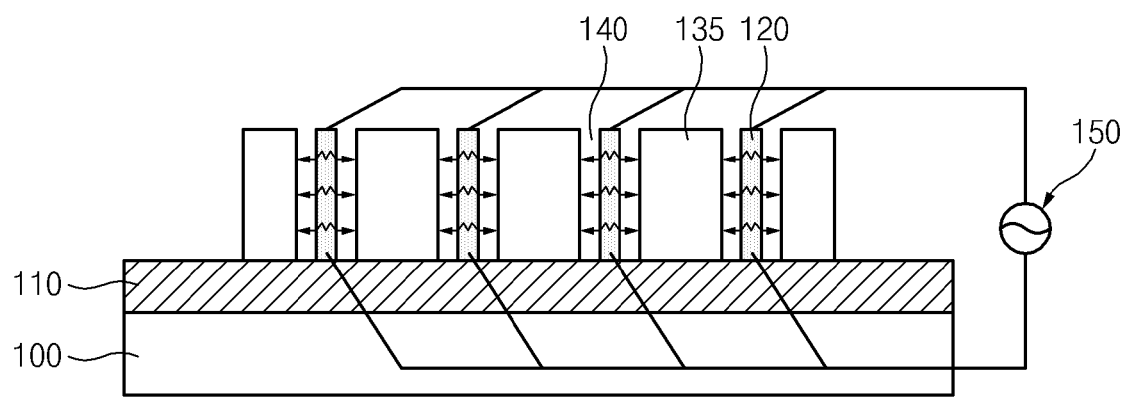

Referring to FIG. 1b, heat is applied to the thermally conductive pattern 120 to change the photosensitive layer 130 in contact with the thermally conductive pattern 120 into a heat sensing region 140. Illustratively, the heat may be applied using an alternative power source 150, and further heat may be transferred directly thereto using a heat generator. At this time, the heat conduction temperature is preferably 150° C. to 200° C.

The pattern size is thus defined based on heat conduction, and a critical dimension (CD) of the pattern can easily be adjusted. The amount of heat (cal) transferred from the thermally conductive pattern 120 to the photosensitive layer 130 is calculated using the following equation:

heat amount=specific heat×mass×temperature change, and thus the critical dimension is adjusted by calculating the temperature change and heating time period using the equation above.

Figure 1C:
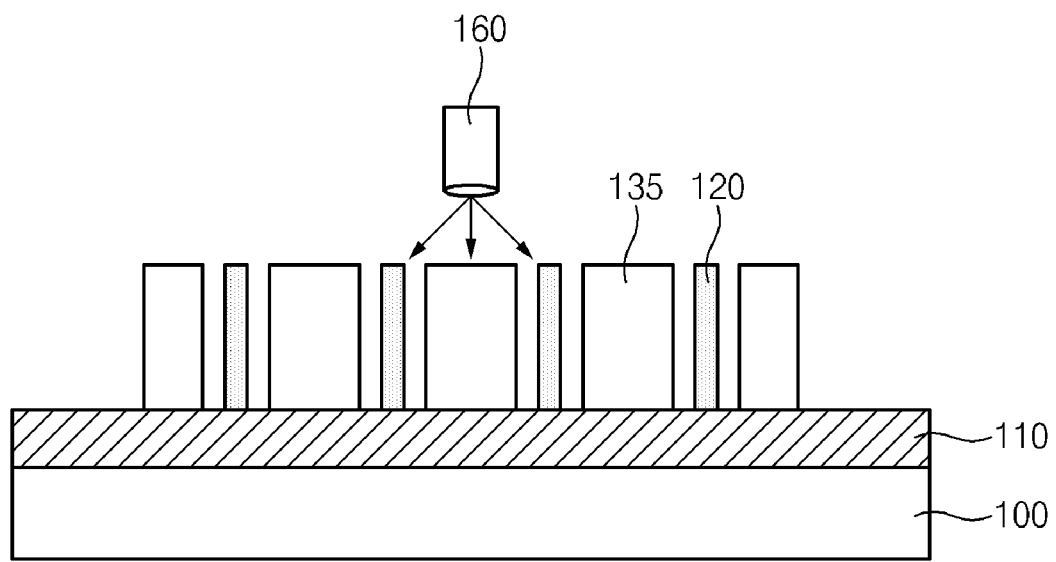

Referring to FIG. 1c, the heat sensing region 140 is removed utilizing a developing liquid injection nozzle 160. At this time, a developing liquid containing alkali component is be preferably used.

Figure 1D:
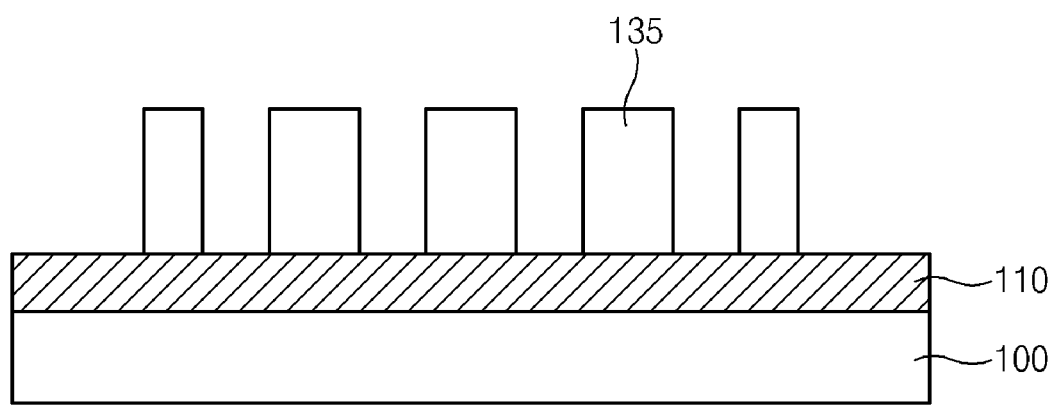

Referring to FIG. 1d, a photosensitive layer pattern 135 is formed defining the designed pattern by removing the thermally conductive substance pattern 120.

Figure 1E:
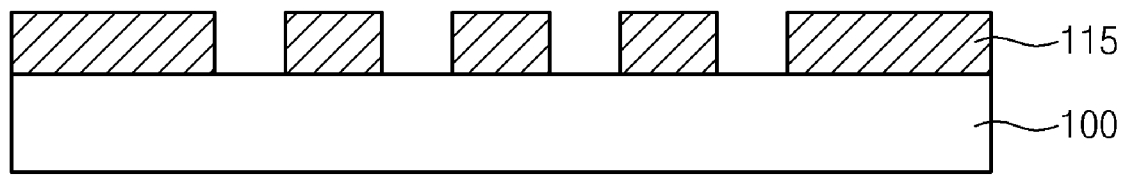

Referring to FIG. 1e, the etching target layer 110 is etched with the photosensitive pattern 135 as an etching mask to form the designed pattern 115.

As described above, according to the method for manufacturing a semiconductor device of the invention, instead of using a lithography process using a light source when forming a photosensitive pattern, a photosensitive layer comprising a thermal acid generator that is reacted with heat to form an acid, and the masking process that is performed in a lithography process using a light source is performed as a heat conduction process using the thermally conductive substance pattern, and thus a patterning process is performed easily without limiting the size and shape of a semiconductor substrate.

The foregoing embodiments of the invention are illustrative and not limiting. Various alternatives and equivalents are possible. The invention is not limited by the type of deposition, etching polishing, and patterning steps described herein, nor is the invention limited to any specific type of semiconductor device. For example, the invention may be implemented in a dynamic random access memory (DRAM) device or non volatile memory device. Other additions, subtractions, or modifications are intended to fall within the scope of the appended claims.

What is claimed is:

1. A method for manufacturing a semiconductor device, the method comprising:
    forming a thermally conductive substance pattern of a thermally conductive substance over a semiconductor substrate;
    applying a photosensitive composition comprising a thermal acid generator to form a photosensitive layer on the entire surface of the semiconductor substrate including the thermally conductive pattern;
    applying heat to the thermally conductive pattern to change at least a portion of the photosensitive layer adjacent to the thermally conductive pattern into a heat sensing region; and
    removing the heat sensing region with a developing liquid; and
    removing the thermally conductive pattern to form a photosensitive layer pattern.

2. A method for manufacturing a semiconductor device as claimed in claim 1, wherein the photosensitive composition comprises 0.1 to 10 parts by weight of the thermal acid generator based on 100 parts by weight of a base polymer.

3. A method for manufacturing a semiconductor device as claimed in claim 1, wherein the thermally conductive substance comprises a metal selected from the group consisting of gold (Au), silver (Ag), aluminum (Al), iron (Fe), copper (Cu), platinum (Pt), tungsten (W), and combinations thereof.

4. A method for manufacturing a semiconductor device as claimed in claim 1, comprising applying heat to the thermally conductive pattern at a temperature of 150° C. to 200° C.

5. A method for manufacturing a semiconductor device as claimed in claim 1, comprising applying heat to the thermally conductive pattern with an alternative power source or a thermal source.

6. A method for manufacturing a semiconductor device as claimed in claim 1, wherein the surface of the semiconductor substrate has a three-dimensional cubic structure.

7. A method for manufacturing a semiconductor device, the method comprising:
    applying a photosensitive composition comprising a thermal acid generator over a semiconductor substrate to form a first photosensitive layer on the semiconductor substrate;
    forming a thermally conductive pattern of a thermally conductive substance over the first photosensitive layer;
    forming a second photosensitive layer over the first photosensitive layer including the thermally conductive pattern;
    applying heat to the thermally conductive pattern to change at least a portion of the photosensitive layer adjacent to the thermally conductive substance pattern into a heat sensing region;
    removing the heat sensing region with a developing liquid; and,
    removing the thermally conductive pattern to form a photosensitive layer pattern.

8. A method for manufacturing a semiconductor device, the method comprising:
    applying a photosensitive composition comprising a thermal acid generator over a semiconductor substrate to form a photosensitive layer on the semiconductor substrate;

contacting a mask including a thermally conductive pattern formed of a thermally conductive substance with an upper surface of the photosensitive layer;

applying heat to the thermally conductive pattern to change at least a portion of the photosensitive layer adjacent to the thermally conductive substance pattern into a heat sensing region;

removing the mask, and, then removing the heat sensing region with a developing liquid to form a photosensitive layer pattern.

* * * * *